(12) United States Patent
Oba et al.

(10) Patent No.: US 11,017,988 B2
(45) Date of Patent: May 25, 2021

(54) CHARGED PARTICLE BEAM APPARATUS

(71) Applicant: HITACHI HIGH-TECH SCIENCE CORPORATION, Tokyo (JP)

(72) Inventors: Hiroshi Oba, Tokyo (JP); Yasuhiko Sugiyama, Tokyo (JP); Yasutaka Otsuka, Tokyo (JP)

(73) Assignee: HITACH HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/572,183

(22) Filed: Sep. 16, 2019

(65) Prior Publication Data
US 2020/0135437 A1 Apr. 30, 2020

(30) Foreign Application Priority Data
Oct. 29, 2018 (JP) .............................. JP2018-202662

(51) Int. Cl.
*H01J 37/32* (2006.01)

(52) U.S. Cl.
CPC .... *H01J 37/32935* (2013.01); *H01J 37/3244* (2013.01); *H01J 37/32082* (2013.01); *H01J 37/32422* (2013.01); *H01J 2237/24564* (2013.01)

(58) Field of Classification Search
CPC .......... H01J 37/32935; H01J 37/32082; H01J 37/3244; H01J 37/32422; H01J 2237/24564
USPC .............. 315/111.21, 111.31, 111.81, 111.91
See application file for complete search history.

(56) References Cited

U.S. PATENT DOCUMENTS

| | | | | | |
|---|---|---|---|---|---|
| 4,812,712 | A | * | 3/1989 | Ohnishi | H01L 21/3185 315/176 |
| 5,272,417 | A | * | 12/1993 | Ohmi | H01J 37/32082 156/345.47 |
| 5,825,035 | A | * | 10/1998 | Mizumura | H01J 37/3056 250/423 R |
| 8,087,379 | B2 | * | 1/2012 | Chandler | B81C 1/00531 118/723 E |
| 8,736,170 | B1 | * | 5/2014 | Liu | H01J 37/063 315/111.31 |

(Continued)

FOREIGN PATENT DOCUMENTS

JP 2017174730 9/2017

*Primary Examiner* — Amy Cohen Johnson
*Assistant Examiner* — Syed M Kaiser
(74) *Attorney, Agent, or Firm* — Holland & Hart LLP (57) ABSTRACT

An charged particle beam apparatus includes: a gas introduction chamber to which raw gas is introduced; a plasma generation chamber connected to the gas introduction chamber; a coil wound around an outer circumference of the plasma generation chamber and receiving a high-frequency power; an extraction electrode applying an extraction voltage to plasma discharged from a plasma aperture at an outlet of the plasma generation chamber; an ampere meter measuring a magnitude of a plasma current caused by the plasma moved out of the plasma aperture; an extraction voltage calculator calculating, based on variation in the magnitude of the plasma current measured by the ampere meter with respect to variation in the extraction voltage, an extraction voltage set value; and a controller controlling the extraction voltage based on the extraction voltage set value calculated by the extraction voltage calculator.

8 Claims, 6 Drawing Sheets

(56) References Cited

U.S. PATENT DOCUMENTS

| | | | | |
|---|---|---|---|---|
| 2002/0053864 | A1* | 5/2002 | Hosono | B82Y 10/00 |
| | | | | 313/310 |
| 2008/0268170 | A1* | 10/2008 | Pern | C23C 16/4584 |
| | | | | 427/569 |
| 2010/0032587 | A1* | 2/2010 | Hosch | H01J 37/06 |
| | | | | 250/492.3 |
| 2010/0321029 | A1* | 12/2010 | Ito | H01J 37/3244 |
| | | | | 324/464 |
| 2012/0000887 | A1* | 1/2012 | Eto | H01J 37/32183 |
| | | | | 216/61 |
| 2012/0018096 | A1* | 1/2012 | Gesche | H01J 37/32082 |
| | | | | 156/345.28 |
| 2013/0013253 | A1* | 1/2013 | Samukawa | H01J 37/32935 |
| | | | | 702/167 |
| 2013/0240720 | A1* | 9/2013 | Sugiyama | H01J 3/14 |
| | | | | 250/252.1 |
| 2014/0292189 | A1* | 10/2014 | Aramaki | H01J 37/08 |
| | | | | 315/1 |
| 2015/0303028 | A1* | 10/2015 | Kamiya | H01J 37/08 |
| | | | | 204/192.34 |
| 2016/0251240 | A1* | 9/2016 | Fraser | C02F 1/008 |
| | | | | 204/664 |
| 2016/0329191 | A1* | 11/2016 | Sieber | H01J 37/32348 |
| 2018/0301388 | A1* | 10/2018 | Ikeda | H01L 22/26 |
| 2020/0027725 | A1* | 1/2020 | Weimer | H01J 37/32449 |

\* cited by examiner

| Ionic species | Plasma density | Extraction voltage set value Vs |
|---|---|---|
| A | α | Vs1 |
| A | β | Vs2 |
| ... | ... | ... |
| B | γ | Vs3 |
| B | δ | Vs4 |
| ... | ... | ... |

DVs

CHARGED PARTICLE BEAM APPARATUS

CROSS REFERENCE TO RELATED APPLICATION(S)

This application claims the benefit of Japanese Patent Application No. 2018-202662, filed Oct. 29, 2018, which is hereby incorporated by reference in its entirety into this application.

BACKGROUND OF THE INVENTION

1. Technical Field

The present invention relates generally to a charged particle beam apparatus.

2. Description of the Related Art

In the related art, there is proposed a charged particle beam apparatus that irradiates an irradiation target in a sample chamber with a charged particle beam, such as a focused ion beam or the like (for example, Patent Document 1).

DOCUMENT OF RELATED ART (Patent Document 1) Japanese Patent Application Publication No. 2017-174730

SUMMARY OF THE INVENTION

The charged particle beam apparatus as described above includes an extraction electrode moving charged particles out of a charged particle source by applying an electric field with respect to an opening part of the charged particle source (for example, an opening part of a plasma aperture). The charged particle beam apparatus appropriately controls a voltage of the extraction electrode (namely, an extraction voltage), thereby controlling angular spread of charged particle beams.

However, depending on the charged particle beam apparatus, the diameter of the opening part of the charged particle source may be relatively small and a correlation between the angular spread of the charged particle beams and the extraction voltage may be low. In this case, there is a problem that it is difficult to determine a set value of the extraction voltage.

The present invention has been made keeping in mind the above problems occurring in the related art, and an object of the present invention is to provide a charged particle beam apparatus that is capable of easily calculating a set value of an extraction voltage.

According to an aspect of the present invention, a charged particle beam apparatus includes: a gas introduction chamber to which raw gas is introduced; a plasma generation chamber connected to the gas introduction chamber; a coil wound around an outer circumference of the plasma generation chamber and receiving high-frequency power; an extraction electrode applying an extraction voltage to plasma discharged from a plasma aperture at an outlet of the plasma generation chamber; an ampere meter measuring a magnitude of a plasma current caused by the plasma moved out of the plasma aperture; an extraction voltage calculator calculating, based on variation in the magnitude of the plasma current measured by the ampere meter with respect to variation in the extraction voltage, an extraction voltage set value which is a set value of the extraction voltage; and a controller controlling the extraction voltage based on the extraction voltage set value calculated by the extraction voltage calculator.

Also, in the charged particle beam apparatus according to the aspect of the present invention, the ampere meter may measure, among the plasma currents, an accelerating current caused by the plasma flowing from the plasma aperture toward an accelerating electrode, and the extraction voltage calculator may calculate, as the extraction voltage set value, the extraction voltage at a point of inflection at which the accelerating current reaches saturation with respect to the variation in the extraction voltage.

Also, in the charged particle beam apparatus according to the aspect of the present invention, the ampere meter may measure, among the plasma currents, an current introduced to extraction electrode caused by the plasma flowing from the plasma aperture to the extraction electrode, and the extraction voltage calculator may calculate, as the extraction voltage set value, the extraction voltage at a point of inflection at which the current introduced to extraction electrode reaches saturation with respect to the variation in the extraction voltage.

Also, in the charged particle beam apparatus according to the aspect of the present invention, the extraction voltage calculator may acquire the point of inflection based on an increased amount of the plasma current with respect to the variation in the extraction voltage, thereby calculating the extraction voltage set value.

Also, in the charged particle beam apparatus according to the aspect of the present invention, the extraction voltage set value may be calculated for each plasma generation condition, and the controller may control the extraction voltage, based on the extraction voltage set value that is associated with the plasma generation condition.

According to the present invention, the charged particle beam apparatus capable of easily calculating the set value of the extraction voltage can be provided.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Embodiment

Hereinafter, a charged particle beam apparatus 10 according to an embodiment of the present invention will be described with reference to the accompanying drawings.

Figure 1:
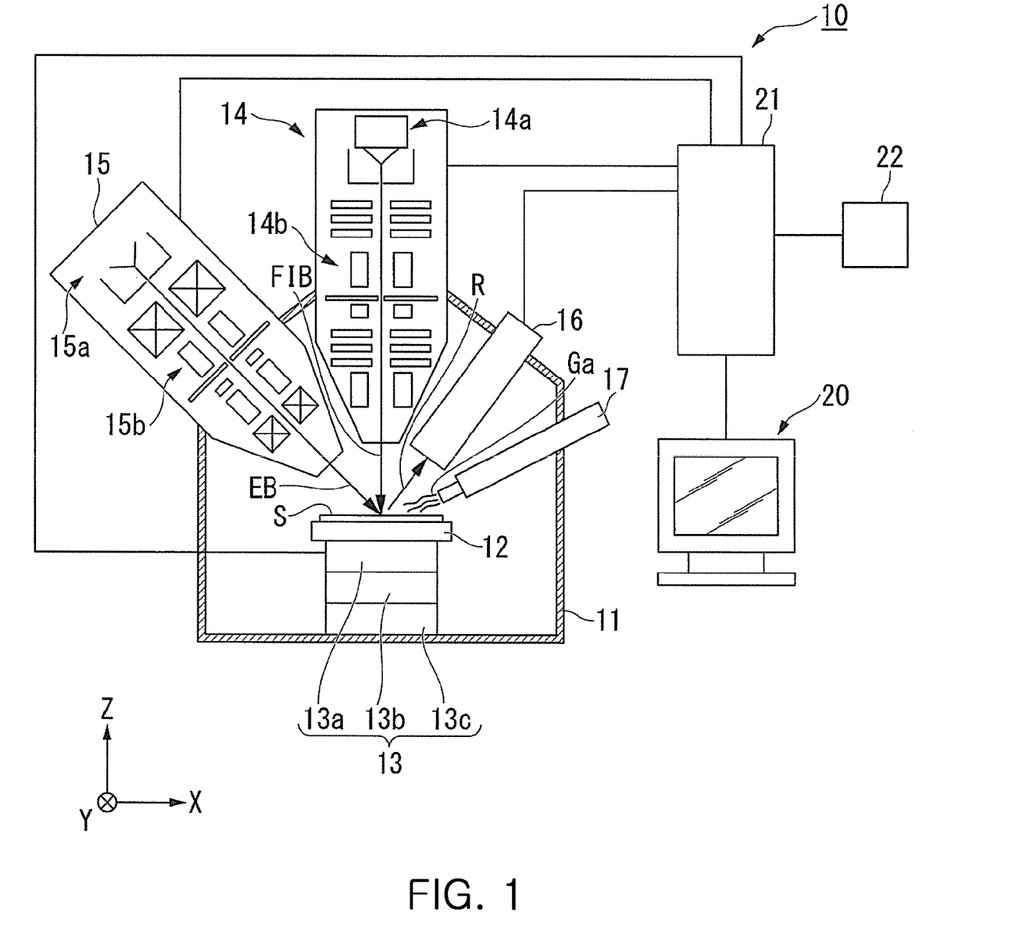
FIG. 1 is a view schematically illustrating a configuration of a charged particle beam apparatus according to an embodiment of the present invention.

FIG. 1 is a view schematically illustrating a configuration of a charged particle beam apparatus 10 according to an embodiment of the present invention.

As shown in FIG. 1, the charged particle beam apparatus 10 includes a sample chamber 11 where the sample chamber's interior is maintained at a vacuum state, a stage 12 fixing a sample S in the sample chamber 11, and a driving unit 13 driving the stage 12. The charged particle beam apparatus 10 includes a focused ion beam column 14 irradiating, with a focused ion beam (FIB), an irradiation target within a predetermined irradiation region (namely, a scanning range) inside the sample chamber 11. The charged particle beam apparatus 10 includes an electron beam column 15 irradiating, with an electron beam (EB), the irradiation target within the predetermined irradiation region inside the sample chamber 11. The charged particle beam apparatus 10 includes a detector 16 detecting secondary charged particles R (secondary electrons and secondary ions, etc.) that are generated from the irradiation target due to irradiation with the focused ion beam or the electron beam.

Further, the charged particle beam apparatus 10 may include a detector (not shown) inside the electron beam column 15, which detects secondary charged particles (back-scattered electrons) generated from the irradiation target due to irradiation with the electron beam. The charged particle beam apparatus 10 includes a gas supply unit 17 supplying assist gas Ga onto a surface of the irradiation target. The charged particle beam apparatus 10 includes a display device 20 displaying image data, and the like, based on the secondary charged particles detected by the detector 16, and also includes a control device 21, and an input device 22.

The charged particle beam apparatus 10 emits the focused ion beam to scan and irradiate the surface of the irradiation target, whereby various types of processing (etching processing, and the like) by sputtering and forming of a deposition film can be performed. The charged particle beam apparatus 10 can perform various types of processing, which include processing of forming a cross section of the sample S for cross-section observation by a scanning electron microscope, or the like, and processing of forming a sample piece (for example, alamella, a needle-shaped sample, or the like) from the sample S for transmission-observation by a transmission electron microscope. The charged particle beam apparatus 10 emits the focused ion beam or the electron beam to scan and irradiate the surface of the irradiation target, such as the sample S, or the like, whereby observation of the surface of the irradiation target can be performed.

The sample chamber 11 is configured in such a manner that exhausting is performed by an exhaust device (not shown) until the sample chamber's interior reaches a desired vacuum state, and that the desired vacuum state is maintained.

The stage 12 holds the sample S.

Being in contact with the stage 12, the driving unit 13 is housed inside the sample chamber 11. The driving unit 13 displaces the stage 12 with respect to a predetermined axis according to a control signal output from the control device 21. The driving unit 13 includes a moving unit 13a moving the stage 12 parallel to the X-axis and the Y-axis, which are parallel to a horizontal plane or which are perpendicular to each other, and to the Z-axis in the vertical direction perpendicular to both the X-axis and the Y-axis. The driving unit 13 includes a tilt unit 13b rotating the stage 12 around the X-axis or the Y-axis, and with a rotating unit 13c rotating the stage 12 around the Z-axis.

The focused ion beam column 14 is fixed to the sample chamber 11 in such a manner that a beam emitting portion (not shown) inside the sample chamber 11 faces the stage 12 at a position in the vertical direction above the stage 12 within the irradiation region and the optical axis is parallel to the vertical direction. Due to this, the irradiation target, such as the sample S, or the like, fixed on the stage 12 may be irradiated with the focused ion beam emitted downwards in the vertical direction.

The focused ion beam column 14 includes a plasma ion source 14a generating ions, and ion optics 14b focusing and deflecting ions moved out of the plasma ion source 14a. The plasma ion source 14a and the ion optics 14b are controlled according to the control signal output from the control device 21. The irradiation position, the irradiation condition, and the like of the focused ion beam are controlled by the control device 21. The ion optics 14b includes, for example, a first electrostatic lens, such as a condenser lens, or the like; an electrostatic deflector; and a second electrostatic lens, such as an objective lens, or the like. Further, although two sets of electrostatic lenses are shown in FIG. 1, three or more sets of electrostatic lens may be provided. In this case, an aperture is provided between each of the lenses.

Figure 2:
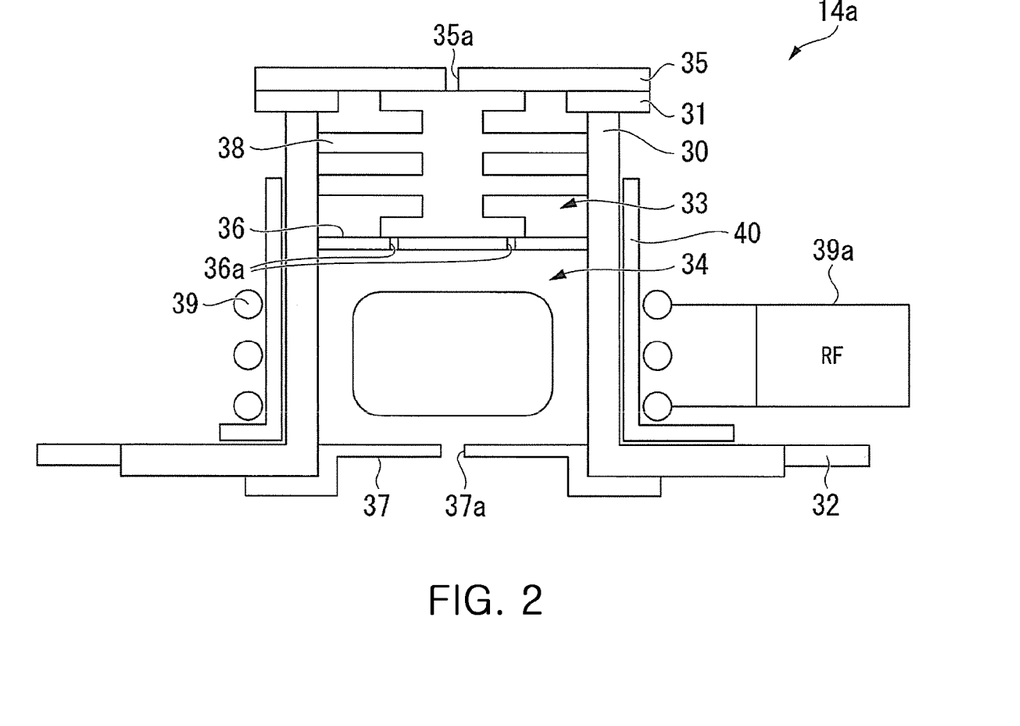
FIG. 2 is a view schematically illustrating a configuration of a plasma ion source according to an embodiment of the present invention.

FIG. 2 is a view schematically illustrating a configuration of a plasma ion source 14a according to an embodiment of the present invention. The plasma ion source 14a is a high-frequency inductively coupled plasma ion source. The plasma ion source 14a includes a torch 30, a first ground potential flange 31, a second ground potential flange 32, a gas introduction chamber 33, a plasma generation chamber 34, a gas introduction chamber member 35, a terminal electrode 36, a plasma aperture 37, an insulation member 38, a coil 39, and a Faraday shield 40.

The torch 30 is formed in a tube shape. The torch 30 is formed of a dielectric material. The dielectric material is, for example, any one of quartz glass, alumina, aluminum nitride, and the like. The torch 30 is provided with a first end at which the first ground potential flange 31 is provided. The torch 30 is provided with a second end at which the second ground potential flange 32 is provided. The first ground potential flange 31 and the second ground potential flange 32 are maintained at the ground potential. The first ground potential flange 31 and the second ground potential flange 32 are made of a non-magnetic metal, for example, copper, aluminum, or the like.

The torch 30 provides the gas introduction chamber 33 and the plasma generation chamber 34. The gas introduction chamber 33 is defined by the gas introduction chamber member 35 connected to the first ground potential flange 31 and by the terminal electrode 36 placed inside the torch 30. The plasma generation chamber 34 is defined by the terminal electrode 36 and by the plasma aperture 37 placed at the second end (namely, the outlet for the plasma) of the torch 30. The terminal electrode 36 and the plasma aperture 37 are made of a non-magnetic metal, for example, copper, tungsten, molybdenum, or the like. The terminal electrode 36 and the plasma aperture 37 are sputtered by the plasma and are attached to the inner wall of the torch 30. Therefore, tungsten or molybdenum having high energy necessary for sputtering is preferable. Further, the terminal electrode 36 is a floating electrode. The gas introduction chamber 33 houses the insulation member 38 therein.

At the outside of the torch 30, the coil 39 wound around the outer circumference of the plasma generation chamber 34 is placed. An RF power source 39a supplies a high-frequency power to the coil 39.

The Faraday shield 40 is provided between the torch 30 and the coil 39. The Faraday shield 40 is a conductive and non-magnetic member in a cylindrical shape, which is provided with a slit on the side surface thereof. The Faraday shield 40 is capable of reducing the capacitive coupling component of the coil 39 and plasma. Due to this, the Faraday shield 40 is capable of reducing the spread of energy of the ion beam. That is, by using the Faraday shield 40, the charged particle beam apparatus 10 is capable of narrowing the ion beam to be fine.

The gas introduction chamber member 35 is provided with an opening part 35a through which raw gas, supplied by a gas supply source (not shown) and/or a flow controller (not shown), is introduced into the gas introduction chamber 33.

The terminal electrode 36, which is placed at the boundary between the gas introduction chamber 33 and the plasma generation chamber 34, is provided with multiple penetrating holes 36a through which raw gas is introduced from the gas introduction chamber 33 into the plasma generation chamber 34. The size R of each of the multiple penetrating holes 36a (for example, the diameter of the circular penetrating hole 36a, or the like) is formed to be smaller than the length of the plasma sheath. The length of the plasma sheath ranges, for example, from several tens of μm to several hundreds of μm.

The plasma aperture 37 is provided with an opening part 37a through which ions are moved out of the plasma generation chamber 34 to the outside.

Referring back to FIG. 1, the electron beam column 15 is fixed to the sample chamber 11 in such a manner that a beam emitting portion (not shown) inside the sample chamber 11 faces the stage 12 in a tilt direction tilted at a predetermined angle with respect to the vertical direction of the stage 12 within the irradiation region and the optical axis is parallel to the tilt direction. Due to this, the irradiation target, such as the sample S, or the like, fixed on the stage 12 may be irradiated with the electron beam emitted downwards in the tilt direction.

The electron beam column 15 includes an electron source 15a generating electrons, and electron optics 15b focusing and deflecting electrons emitted from the electron source 15a. The electron source 15a and the electron optics 15b are controlled according to the control signal output from the control device 21. The irradiation position, the irradiation condition, and the like of the electron beam are controlled by the control device 21. The electron optics 15b includes, for example, an electron lens, a deflector, and the like.

Further, the electron beam column 15 and the focused ion beam column 14 may be exchangeably arranged so that the electron beam column 15 may be placed in the vertical direction and the focused ion beam column 14 in the tilt direction tilted at a predetermined angle with respect to the vertical direction.

The detector 16 detects the intensity (namely, the amount of the secondary charged particles) of the secondary charged particles R (secondary electrons and secondary ions, etc.) radiated from the irradiation target when the irradiation target, such as the sample S, or the like, is irradiated with the focused ion beam or the electron beam; and outputs information on the amount of the detected secondary charged particles R. The detector 16 is fixed to the sample chamber 11 in such a manner as to be placed at a position where the amount of the secondary charged particles R is possibly detected inside the sample chamber 11, for example, an upper portion tilted with respect to the irradiation target, such as the sample S within the irradiation region, or the like.

The gas supply unit 17 is fixed to the sample chamber 11 in such a manner that a gas spray part (not shown) faces the stage 12 inside the sample chamber 11. The gas supply unit 17 is capable of supplying, to the sample S, etching gas for selectively stimulating etching of the sample S by the focused ion beam depending on the material of the sample S, and deposition gas for forming a deposition film on the surface of the sample S by a deposit, such as metal, an insulator, or the like. For example, the etching gas, such as xenon fluoride for a Si-based sample S, water vapor for an organic-based sample S, or the like, is supplied to the sample S while the focused ion beam is emitted, thereby selectively stimulating etching. Also, for example, the deposition gas of compound gas containing phenanthrene, platinum, carbon, tungsten, or the like, is supplied to the sample S while the focused ion beam is emitted, thereby depositing a solid component decomposed from the deposition gas on the surface of the sample S.

The control device 21 is placed outside the sample chamber 11 and is connected to the display device 20 and to the input device 22, such as a mouse, a keyboard, or the like, for outputting a signal resulting from input operation of an operator.

The control device 21 controls overall operation of the charged particle beam apparatus 10 by a signal output from the input device 22, a signal generated by preset automatic operation control processing, or the like.

The control device 21 converts the amount of the secondary charged particles detected by the detector 16 while the irradiation position for the charged particle beam is scanned, into a luminance signal corresponding to the irradiation position, and generates image data representing the shape of the irradiation target by using two-dimensional position distribution of the amount of the detected secondary charged particles. The control device 21 controls the display device 20 to display the generated image data as well as a screen for executing operations, such as zoom-in, zoom-out, shift, rotation, and the like of each image data. The control device 21 controls the display device 20 to display a screen for performing various settings, such as processing settings, and the like.

Figure 3:
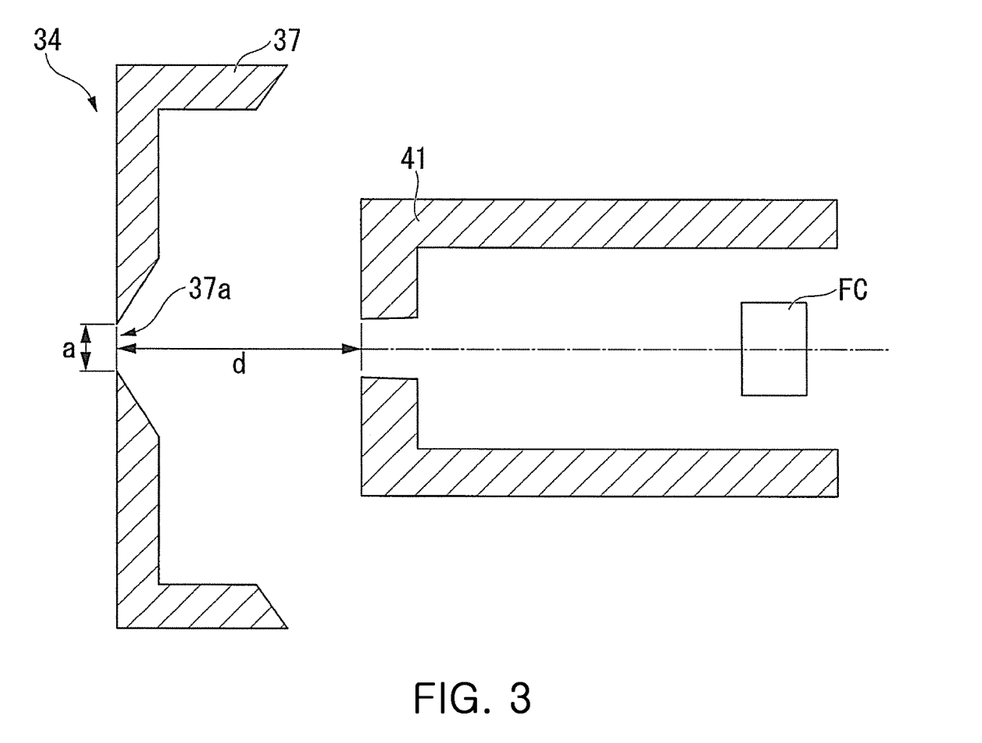
FIG. 3 is a view illustrating an example of a positional relationship between a plasma aperture and an extraction electrode according to an embodiment of the present invention.

FIG. 3 is a view illustrating an example of a positional relationship between the plasma aperture 37 and the extraction electrode 41 according to an embodiment of the present invention.

As described above, the plasma aperture 37 is provided with the opening part 37a through which ions are moved out of the plasma generation chamber 34 to the outside. The extraction electrode 41 applies an extraction voltage Vext to the plasma in the opening part 37a of the plasma aperture 37, and moves the plasma outwards through the opening part 37a.

The diameter a shown in this figure refers to a diameter of the opening part 37a of the plasma aperture 37. The distance d refers to a distance between the opening part 37a and the extraction electrode 41.

In the meantime, angular spread of the ion beams moved out of the plasma generation chamber 34 to the outside depends on the extraction voltage Vext applied to the extraction electrode 41. The dependence of the angular spread of the ion beams on the extraction voltage Vext increases, as the ratio (diameter a/distance d) of the diameter a and to the distance d increases. That is, as the ratio of the diameter a and the distance d increases, variation in the angular spread of the ion beams depending on variation in the extraction voltage Vext is more sensitive. In the charged particle beam apparatus 10 according to the embodiment of the present invention, the diameter a is relatively small. Therefore, in the charged particle beam apparatus 10 according to the embodiment of the present invention, the variation in the angular spread of the ion beams depending on the variation in the extraction voltage Vext is not sensitive (dull), and thus it is difficult to determine a set value (an extraction voltage set value Vs) of the extraction voltage Vext. In this case, a procedure for determining the extraction voltage set value Vs in the related art will be described with reference to FIG. 7.

Figure 7:
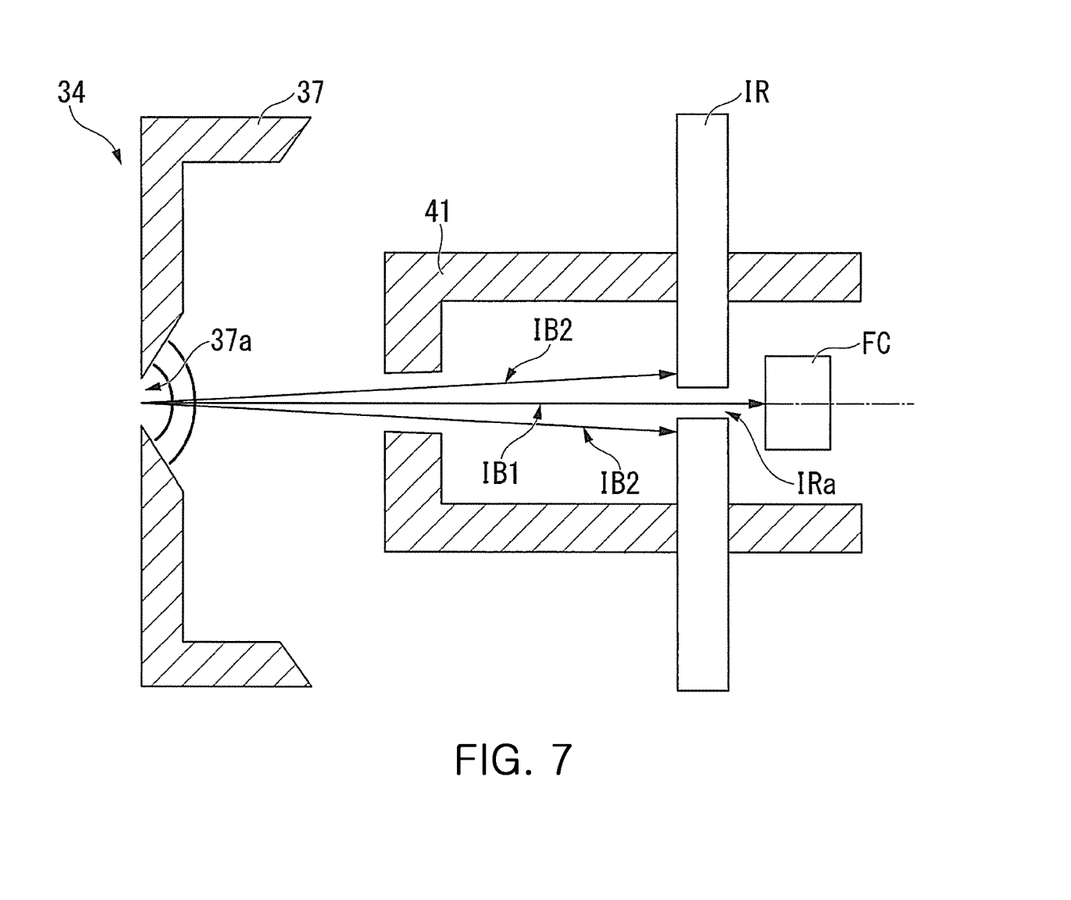
FIG. 7 is a view illustrating an example of a procedure for determining an extraction voltage set value in the related art.

The Procedure for Determining the Extraction Voltage Set Value Vs in the Related Art FIG. 7 is a view illustrating an example of a procedure for determining an extraction voltage set value Vs in the related art. The ion beams flow from the opening part 37a of the plasma aperture 37 toward the extraction electrode 41. Among these beams, some ion beams (ion beams IB1s) pass through a diaphragm aperture IRa of a diaphragm IR and then enter into a Faraday cup FC. Further, among these beams, some ion beams (ion beams IB2s) do not pass through the diaphragm aperture IRa and do not enter into the Faraday cup FC.

The case where the amount (for example, luminance) of the ion beams reaching the Faraday cup FC is large indicates the case where the amount of the ion beams passing through a small diaphragm aperture IRa is large—in other words, the angular spread of ion beams is small. The amount of the ion beams IB1s passing through the diaphragm aperture IRa and then reaching the Faraday cup FC depend on the extraction voltage Vext of the extraction electrode 41. For example, in the case where the extraction voltage Vext is varied, when the amount of the ion beams reaching the Faraday cup FC increases, it indicates that the ion beams passing through the diaphragm aperture IRa increase and the ion beams not passing through the diaphragm aperture IRa decrease. By measuring the relationship between the extraction voltage Vext and the amount of the ion beams IB1s reaching the Faraday cup FC and by finding the extraction voltage Vext in which the amount of the ion beams IB1s reaches saturation, an appropriate extraction voltage set value Vs at which the angular spread of ion beams is small may be acquired.

However, according to the procedure for determining the extraction voltage set value Vs in the related art, there are some problems that the diaphragm IR is wasted due to irradiation with the ion beams, the measuring is time consuming, and so on.

Figure 4:
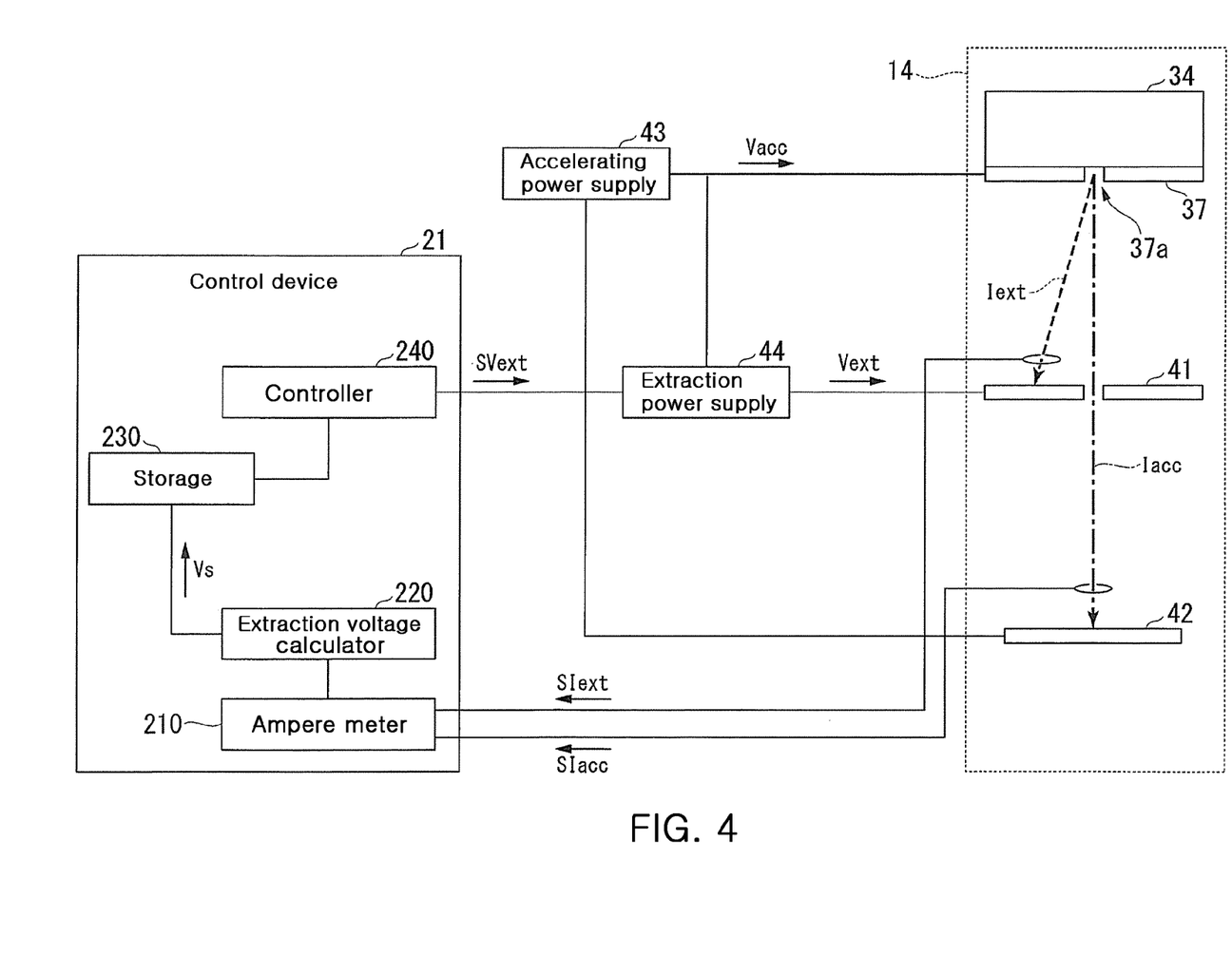
FIG. 4 is a view illustrating an example of a functional configuration of a control device according to an embodiment of the present invention.

A Procedure for Determining the Extraction Voltage Set Value Vs According to an Embodiment of the Present Invention FIG. 4 is a view illustrating an example of a functional configuration of the control device 21 according to an embodiment of the present invention. The control device 21 includes an ampere meter 210, an extraction voltage calculator 220, a storage 230, and a controller 240.

In this detailed example, the plasma generation chamber 34, the plasma aperture 37 (the opening part 37a), the extraction electrode 41, and an accelerating electrode 42 are placed in the focused ion beam column 14, in this order. The accelerating electrode 42 is assigned a ground potential. An accelerating power supply 43 applies an accelerating voltage Vacc between the plasma aperture 37 and the accelerating electrode 42. An extraction power supply 44 applies the extraction voltage Vext between the extraction electrode 41 and the accelerating electrode 42.

The plasma moved out through the opening part 37a of the plasma aperture 37 is accelerated by the accelerating voltage Vacc and is thus turned into ion beams. Some of the ion beams are introduced to the extraction electrode 41, and the other ion beams reach the accelerating electrode 42. In the following description, among the plasma currents caused by the plasma moved out through the opening part 37a, the plasma current introduced to the extraction electrode 41 is referred to as an current introduced to extraction electrode Iext, and the plasma current reaching the accelerating electrode 42 rather than being introduced to the extraction electrode 41 is referred to as an accelerating current Iacc.

The ampere meter 210 measures the magnitude of the plasma current of the plasma moved out of the plasma aperture 37. Specifically, the ampere meter 210 acquires an accelerating current detection signal SIacc. The accelerating current detection signal SIacc represents the magnitude of the accelerating current Iacc. The ampere meter 210 measures, based on the acquired accelerating current detection signal SIacc, the magnitude of the accelerating current Iacc.

That is, the ampere meter 210 measures, among the plasma currents, the accelerating current Iacc caused by the plasma flowing from the plasma aperture 37 toward the accelerating electrode 42.

Further, the ampere meter 210 may acquire an current introduced to extraction electrode detection signal SIext instead of the accelerating current detection signal SIacc or in addition to the accelerating current detection signal SIacc. This current introduced to extraction electrode detection signal SIext represents the magnitude of the current introduced to extraction electrode Iext. In this case, the ampere meter 210 measures, based on the acquired current introduced to extraction electrode detection signal SIext, the magnitude of the current introduced to extraction electrode Iext.

That is, the ampere meter 210 measures, among the plasma currents, the current introduced to extraction electrode Iext caused by the plasma flowing from the plasma aperture 37 to the extraction electrode 41.

The extraction voltage calculator 220 calculates, based on the variation in the magnitude of the plasma current with respect to the variation in the extraction voltage Vext, the extraction voltage set value Vs, which is the set value of the extraction voltage Vext. A detailed example of calculating the extraction voltage set value Vs by the extraction voltage calculator 220 will be described with reference to FIG. 5.

Figure 5:
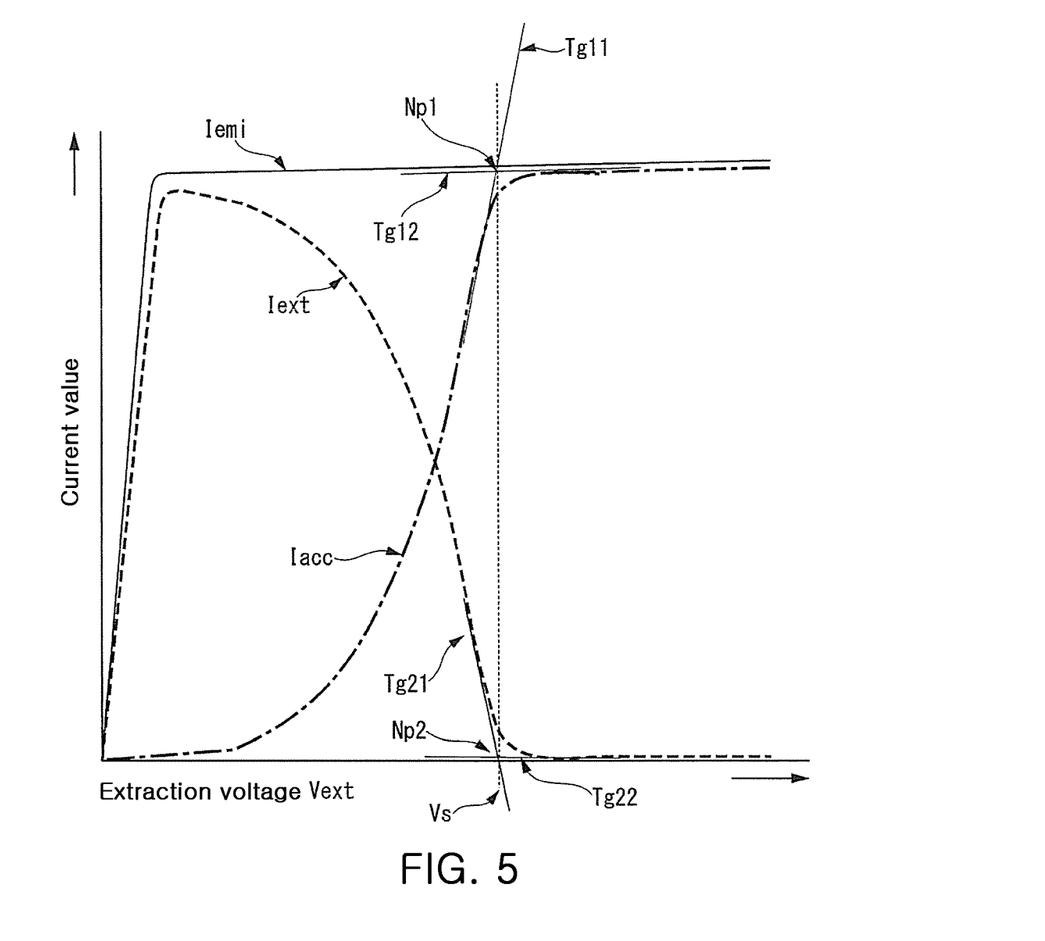
FIG. 5 is a view illustrating an example of a characteristic of variation in a plasma current with respect to an extraction voltage according to an embodiment of the present invention.

FIG. 5 is a view illustrating an example of a characteristic of variation in a plasma current with respect to the extraction voltage Vext according to an embodiment of the present invention. In this figure, the horizontal axis represents the extraction voltage Vext and the vertical axis represents the magnitudes of the plasma currents (the accelerating current Iacc) and the current introduced to extraction electrode (Iext). Herein, between all the currents (emission current Iemi) caused by the plasma moved out of the plasma aperture 37, the accelerating current Iacc and the current introduced to extraction electrode Iext, a relation shown in Equation (1) is established.

$$Iemi = Iacc + Iext \quad (1)$$

As shown in this figure, when the extraction voltage Vext is increased (the voltage is lowered), the accelerating current Iacc is increased and the current introduced to extraction electrode Iext is decreased. Further, when the extraction voltage Vext is increased (the voltage is lowered), the increase in the accelerating current Iacc reaches saturation and the decrease in the current introduced to extraction electrode Iext reaches saturation.

The extraction voltage calculator 220 calculates, as the extraction voltage set value Vs, the extraction voltage Vext when the increase in the accelerating current Iacc reaches saturation (or when the decrease in the current introduced to extraction electrode Iext reaches saturation). The extraction voltage calculator 220 stores the calculated extraction voltage set value Vs in the storage unit 230.

The controller 240 controls, based on the extraction voltage set value Vs calculated by the extraction voltage calculator 220, the extraction voltage Vext that the extraction power supply 44 outputs. Specifically, the controller 240 reads the extraction voltage set value Vs stored in the storage unit 230 and generates an extraction voltage control signal SVext based on the read extraction voltage set value Vs. The controller 240 outputs the generated extraction voltage control signal SVext to the extraction power supply 44. This extraction voltage control signal SVext is a signal for controlling the extraction voltage Vext. The extraction power supply 44 generates, based on the extraction voltage control signal SVext output by the controller 240, the extraction voltage Vext.

Hereinbelow, an example of the extraction voltage set value Vs stored in the storage unit 230 will be described with reference to FIG. 6.

Figure 6:
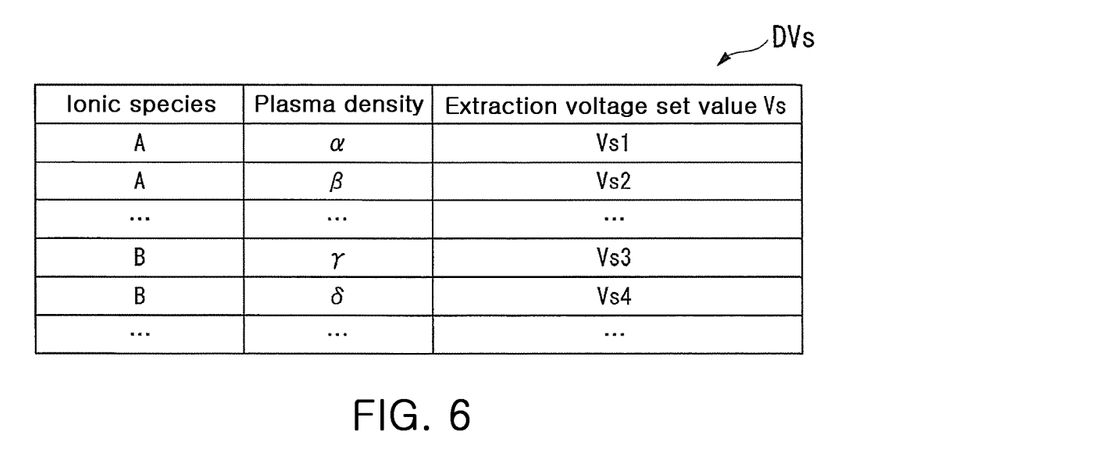
FIG. 6 is a view illustrating an example of extraction voltage setting information according to an embodiment of the present invention.

FIG. 6 is a view illustrating an example of extraction voltage setting information DVs according to an embodiment of the present invention.

In some cases, the extraction voltage set value Vs may vary depending on plasma generation conditions. Herein, the plasma generation conditions include plasma ionic species, plasma density, and the like. The extraction voltage calculator 220 calculates the extraction voltage set value Vs for each of the plasma generation conditions. The extraction voltage calculator 220 associates the plasma generation condition with the calculated extraction voltage set value Vs and stores the resultant as the extraction voltage setting information DVs in the storage unit 230.

In a detailed example in this figure, in the case where the plasma ionic species is [A] and the plasma density is [α], the extraction voltage calculator 220 calculates, from the characteristics of the variation in the plasma currents when the extraction voltage set value Vs is varied, an extraction voltage set value Vs1 as the extraction voltage set value Vs. The extraction voltage calculator 220 associates the plasma ionic species of [A] and the plasma density of [α] with the calculated extraction voltage set value Vs1 and stores the resultant as the extraction voltage setting information DVs in the storage unit 230.

Also, in the case where the plasma ionic species is [A] and the plasma density is [β], the extraction voltage calculator 220 calculates, from the characteristics of the variation in the plasma currents when the extraction voltage set value Vs is varied, an extraction voltage set value Vs2 as the extraction voltage set value Vs. The extraction voltage calculator 220 associates the plasma ionic species of [A] and the plasma density of [β] with the calculated extraction voltage set value Vs2 and stores the resultant as the extraction voltage setting information DVs in the storage unit 230.

In the same manner under other plasma generation conditions, the extraction voltage calculator 220 associates the plasma ionic species and the plasma density with the calculated extraction voltage set value Vs and stores the resultant as the extraction voltage setting information DVs in the storage unit 230.

Referring back to FIG. 3, the operator of the charged particle beam apparatus 10 performs input operation of the plasma generation conditions (for example, the plasma ionic species and the plasma density), by using the input device 22. The input device 22 outputs, based on the input operations, the information indicating the plasma generation condition to the controller 240. The controller 240 acquires the information indicating the plasma generation condition input by the operator, from the input device 22. The controller 240 searches for, using the acquired information indicating the plasma generation condition as a search key, the extraction voltage setting information DVs stored in the storage unit 230. The controller 240 acquires the extraction voltage set value Vs associated with the acquired plasma generation condition in the extraction voltage setting information DVs, from the storage unit 230.

Hereinbelow, the case where the operator of the charged particle beam apparatus 10 performs input operation of the plasma ionic species [A] and the plasma density [β] will be described as an example. In this case, the controller 240 acquires, from the extraction voltage setting information (DVs) shown in FIG. 6, the extraction voltage set value Vs (namely, the extraction voltage set value Vs2) associated with the plasma ionic species [A] and the plasma density [β]. The controller 240 controls the extraction power supply 44 based on the acquired extraction voltage set value Vs2.

That is, the extraction voltage set value Vs is calculated for each of the plasma generation conditions. The controller 240 controls the extraction voltage Vext output from the extraction power supply 44, based on the extraction voltage set value Vs that is associated with the plasma generation condition.

Calculation of the Extraction Voltage Set Value Vs

Hereinbelow, a detailed example of calculating the extraction voltage set value Vs by the extraction voltage calculator 220 will be described. As described above with reference to FIG. 5, the extraction voltage calculator 220 calculates the extraction voltage set value Vs based on the variation in the magnitude of the plasma current measured by the ampere meter 210 with respect to the variation in the extraction voltage Vext.

A Procedure (1) for Calculating the Extraction Voltage Set Value Vs

The extraction voltage calculator 220 calculates, as the extraction voltage set value Vs, the extraction voltage Vext at a point of inflection at which the accelerating current Iacc reaches saturation with respect to the variation in the extraction voltage Vext. In the example shown in FIG. 5, the extraction voltage calculator 220 calculates the slope of the accelerating current Iacc and acquires the tangent line Tg11 of the accelerating current Iacc, within a range in which as the extraction voltage Vext increases (the voltage is lowered), the accelerating current Iacc increases. The extraction voltage calculator 220 also calculates the slope of the accelerating current Iacc and acquires the tangent line Tg12 of the accelerating current Iacc, in the case where the extraction voltage Vext increases (the voltage is lowered) and the accelerating current Iacc reaches saturation. The extraction voltage calculator 220 acquires the node point Np1 of the tangent line Tg11 and the tangent line Tg12. The extraction voltage calculator 220 calculates the extraction voltage Vext of the acquired node point Np1 as the extraction voltage set value Vs.

That is, the extraction voltage calculator 220 acquires the point of inflection based on the increased amount of the plasma current with respect to the variation in the extraction voltage Vext, thereby calculating the extraction voltage set value Vs.

Herein, the accelerating current Iacc is proportional to the (3/2)-th power of the extraction voltage Vext and is monotonously increased by the increase in the extraction voltage Vext. That is, the accelerating current Iacc has the maximum positive slope near the point of inflection. In this case, the extraction voltage calculator 220 may acquire the tangent line Tg11 using the maximum value of the slope of the accelerating current Iacc as the slope of the tangent line Tg11.

A Procedure (2) for Calculating the Extraction Voltage Set Value Vs

The extraction voltage calculator 220 calculates, as the extraction voltage set value Vs, the extraction voltage Vext at a point of inflection at which the current introduced to extraction electrode Iext reaches saturation with respect to the variation in the extraction voltage Vext. In the example shown in FIG. 5, the extraction voltage calculator 220 calculates the slope of the current introduced to extraction electrode Iext and acquires the tangent line Tg21 of the current introduced to extraction electrode Iext, within a range in which as extraction voltage Vext increases (the voltage is lowered), the current introduced to extraction electrode Iext decreases. The extraction voltage calculator 220 also calculates the slope of the current introduced to extraction electrode Iext and acquires the tangent line Tg22 of the current introduced to extraction electrode Iext, in the case where the extraction voltage Vext increases (the voltage is lowered) and the current introduced to extraction electrode Iext reaches saturation. The extraction voltage calculator 220 acquires the node point Np2 of the tangent line Tg21 and the tangent line Tg22. The extraction voltage calculator 220 calculates the extraction voltage Vext of the acquired node point Np2 as the extraction voltage set value Vs.

That is, the extraction voltage calculator 220 acquires the point of inflection based on the increased amount of the plasma current with respect to the variation in the extraction voltage Vext, thereby calculating the extraction voltage set value Vs.

Herein, the current introduced to extraction electrode Iext is proportional to the (3/2)-th power of the extraction voltage Vext and is monotonously decreased by the increase in the extraction voltage Vext. That is, the current introduced to extraction electrode Iext has the maximum negative slope near the point of inflection. In this case, the extraction voltage calculator 220 may acquire the tangent line Tg21 using the maximum value of the slope of the current introduced to extraction electrode Iext as the slope of the tangent line Tg21.

Summation of Embodiment

As described above, the charged particle beam apparatus 10 includes the extraction voltage calculator 220. The extraction voltage calculator 220 calculates the extraction voltage set value Vs based on the variation in the magnitude of the plasma current with respect to the variation in the extraction voltage Vext. According to the charged particle beam apparatus 10 configured as described above, since the extraction voltage set value Vs is calculated without using the diaphragm IR, it is possible to calculate the extraction voltage set value Vs without waste of the diaphragm IR, and the like, which is the problem occurring in the related art.

That is, according to the charged particle beam apparatus 10 of the embodiment, it is possible to easily calculate the extraction voltage set value Vs.

Also, the charged particle beam apparatus 10 of the embodiment measures the characteristics of the variation in the plasma currents with respect to the variation in the extraction voltage Vext, thereby calculating the extraction voltage set value Vs.

As described above, in the related art, on the premise that the correlation between the extraction voltage Vext and the angular spread of ion beams is high, the extraction voltage Vext is adjusted while detecting the amount of the ion beams passing through the diaphragm IR, whereby the angular spread of the ion beams is adjusted. However, as described above, in the case where the ratio (a/d) of the diameter a of the opening part 37*a* of the plasma aperture 37 to the distance d between the plasma aperture 37 and the extraction electrode 41 is small, the correlation between the extraction voltage Vext and the angular spread of the ion beams is low. In the case where the diameter a of the opening part 37*a* is small, even though the amount of the ion beams passing through the diaphragm IR is detected in the same manner as in the related art described above, the correlation between the angular spread of the ion beams and the extraction voltage Vext is low, so that it is difficult to determine the extraction voltage set value Vs.

In the meantime, since the charged particle beam apparatus 10 of the embodiment measures the characteristics of the variation in the plasma currents with respect to the variation in the extraction voltage Vext, even if the opening diameter a of the opening part 37*a* is small, it is possible to calculate the extraction voltage set value Vs regardless of the small opening diameter of the opening part 37*a*. That is, according to the charged particle beam apparatus 10 of the embodiment, it is possible to easily calculate the extraction voltage set value Vs.

Also, according to the charged particle beam apparatus 10 of the embodiment, when any one plasma current among the accelerating current Iacc and the current introduced to extraction electrode Iext is detected, it is possible to calculate the extraction voltage set value Vs. That is, according to the charged particle beam apparatus 10 of the embodiment, it is possible to easily calculate the extraction voltage set value Vs.

Also, according to the charged particle beam apparatus 10 of the embodiment, the extraction voltage set value Vs is calculated by acquiring the point of inflection of the plasma current with respect to the variation in the extraction voltage Vext, so that it is possible to easily calculate the extraction voltage set value Vs using geometric operation. That is, according to the charged particle beam apparatus 10 of the embodiment, it is possible to easily calculate the extraction voltage set value Vs.

Also, the charged particle beam apparatus 10 of the embodiment calculates the extraction voltage set value Vs for each of the plasma generation conditions. According to the charged particle beam apparatus 10 configured as described above, even when the plasma generation conditions are varied, it is possible to calculate the extraction voltage set value Vs, respectively. For example, the charged particle beam apparatus 10 calculates the extraction voltage set value Vs for each of the various plasma generation conditions, and stores the results of the calculation in the storage unit 230 as the extraction voltage setting information DVs. In this case, the charged particle beam apparatus 10 reads, each time when the plasma generation condition is varied, the extraction voltage set value Vs associated with the plasma generation condition from the extraction voltage setting information DVs stored in the storage unit 230, and then may control the extraction voltage Vext.

Also, the charged particle beam apparatus 10 includes the extraction voltage calculator 220. Due to this, according to the charged particle beam apparatus 10, even if ion beams are generated under a new plasma generation condition that is not included in the extraction voltage setting information DVs, the characteristics of the variation in the plasma currents is measured with respect to the variation in the extraction voltage Vext, thereby calculating the extraction voltage set value Vs appropriate for this plasma generation condition.

Although the embodiment of the present invention has been described with reference to the accompanying drawings, the detailed configuration is not limited to the embodiment and modifications can be added appropriately without departing from the scope of the present invention. Also, without departing from the scope of the present invention, the above-described embodiments can be combined appropriately.

Also, each of the above-described devices has a computer therein. Further, each processing process of each of the above-described devices is stored in the form of a program in a computer-readable recording medium, and the computer reads the program to execute, whereby the processing is performed. Herein, the computer-readable recording medium refers to a magnetic disk, a magneto-optical disk, a CD-ROM, a DVD-ROM, a semiconductor memory, or the like. Also, it is possible that the computer program is transmitted to the computer via a communication line and the computer receiving the transmission executes the corresponding program.

Further, the program may be for implementing a part of the above-described function. Further, the program may be a so-called difference file (difference program) for implementing the above-described function by using a combination with the program already recorded in the computer system.

What is claimed is:

1. A charged particle beam apparatus comprising:
a gas introduction chamber to which raw gas is introduced;
a plasma generation chamber connected to the gas introduction chamber;
a coil wound around an outer circumference of the plasma generation chamber and receiving high-frequency power;
an extraction electrode applying an extraction voltage to plasma discharged from a plasma aperture at an outlet of the plasma generation chamber;
an ampere meter measuring a magnitude of an accelerating current caused by the plasma flowing from the plasma aperture toward an accelerating electrode and/or a current introduced to the extraction electrode caused by the plasma flowing from the plasma aperture to the extraction electrode among a plasma current caused by the plasma moved out of the plasma aperture;
an extraction voltage calculator calculating, based on variation in the magnitude of the plasma current measured by the ampere meter with respect to variation in the extraction voltage, an extraction voltage set value which is a set value of the extraction voltage; and
a controller controlling the extraction voltage based on the extraction voltage set value calculated by the extraction voltage calculator,
the extraction voltage calculator calculates, as the extraction voltage set value, the extraction voltage at a point of inflection at which the accelerating current reaches saturation with respect to the variation in the extraction voltage.

2. A charged particle beam apparatus comprising:
a gas introduction chamber to which raw gas is introduced;
a plasma generation chamber connected to the gas introduction chamber;
a coil wound around an outer circumference of the plasma generation chamber and receiving high-frequency power;
an extraction electrode applying an extraction voltage to plasma discharged from a plasma aperture at an outlet of the plasma generation chamber;
an ampere meter measuring a magnitude of an accelerating current caused by the plasma flowing from the plasma aperture toward an accelerating electrode and/or a current introduced to the extraction electrode caused by the plasma flowing from the plasma aperture to the extraction electrode among a plasma current caused by the plasma moved out of the plasma aperture;
an extraction voltage calculator calculating, based on variation in the magnitude of the plasma current measured by the ampere meter with respect to variation in the extraction voltage, an extraction voltage set value which is a set value of the extraction voltage; and
a controller controlling the extraction voltage based on the extraction voltage set value calculated by the extraction voltage calculator,
wherein the extraction voltage calculator calculates, as the extraction voltage set value, the extraction voltage at a point of inflection at which the current introduced to the extraction electrode reaches saturation with respect to the variation in the extraction voltage.

3. The charged particle beam apparatus of claim 1, wherein the extraction voltage calculator calculates the extraction voltage set value from a point of inflection that is determined based on an increased amount of the plasma current with respect to the variation in the extraction voltage.

4. The charged particle beam apparatus of claim 2, wherein the extraction voltage calculator calculates the extraction voltage set value from a point of inflection that is determined based on an increased amount of the plasma current with respect to the variation in the extraction voltage.

5. The charged particle beam apparatus of claim 1, wherein the extraction voltage set value is calculated for each plasma generation condition, and
    the controller controls the extraction voltage, based on the extraction voltage set value that is associated with the plasma generation condition.

6. The charged particle beam apparatus of claim 2, wherein the extraction voltage set value is calculated for each plasma generation condition, and
    the controller controls the extraction voltage, based on the extraction voltage set value that is associated with the plasma generation condition.

7. The charged particle beam apparatus of claim 3, wherein the extraction voltage set value is calculated for each plasma generation condition, and
    the controller controls the extraction voltage, based on the extraction voltage set value that is associated with the plasma generation condition.

8. The charged particle beam apparatus of claim 4, wherein the extraction voltage set value is calculated for each plasma generation condition, and
    the controller controls the extraction voltage, based on the extraction voltage set value that is associated with the plasma generation condition.

\* \* \* \* \*